(12) United States Patent
Goossens et al.

(10) Patent No.: US 10,354,905 B2
(45) Date of Patent: Jul. 16, 2019

(54) CARRIER FOR TEMPORARY BONDED WAFERS

(71) Applicant: NV Bekaert SA, Zwevegem (BE)

(72) Inventors: Davy Goossens, Kluisbergen (BE); Jérémie De Baerdemaeker, Anzegem (BE)

(73) Assignee: NV BEKAERT SA, Zwevegem (BE)

( * ) Notice: Subject to any disclaimer, the term of this patent is extended or adjusted under 35 U.S.C. 154(b) by 148 days.

(21) Appl. No.: 15/557,202

(22) PCT Filed: Mar. 2, 2016

(86) PCT No.: PCT/EP2016/054433
§ 371 (c)(1),
(2) Date: Sep. 11, 2017

(87) PCT Pub. No.: WO2016/142237
PCT Pub. Date: Sep. 15, 2016

(65) Prior Publication Data
US 2018/0040500 A1    Feb. 8, 2018

(30) Foreign Application Priority Data
Mar. 11, 2015  (EP) ..................................... 15158634

(51) Int. Cl.
*H01L 21/683* (2006.01)
*B32B 15/01* (2006.01)
(Continued)

(52) U.S. Cl.
CPC .......... *H01L 21/6835* (2013.01); *B22F 7/004* (2013.01); *B24B 37/27* (2013.01);
(Continued)

(58) Field of Classification Search
USPC .......................................................... 156/247
See application file for complete search history.

(56) References Cited

U.S. PATENT DOCUMENTS 4,902,420 A * 2/1990 Pall ........................ B01D 29/41
210/346
5,267,607 A * 12/1993 Wada .................. H01J 37/3244
118/724
(Continued)

FOREIGN PATENT DOCUMENTS

| FR | 2 835 242 | 8/2003 |
|---|---|---|
| WO | 02/29856 | 4/2002 |

OTHER PUBLICATIONS

Machine Translation of FR 2835242 (Year: 2019).*
International Search Report dated Jan. 6, 2016 in International (PCT) Application No. PCT/EP2016/054433.

*Primary Examiner* — Sing P Chan
(74) *Attorney, Agent, or Firm* — Wenderoth, Lind & Ponack, L.L.P.

(57) ABSTRACT

Carrier onto which a wafer can be temporarily bonded. The carrier comprises a plate shaped laminate. The plate shaped laminate comprises a first layer. The first layer comprises a metal foil or a metal sheet. The plate shaped laminate comprises a second layer comprising a porous metal medium with three-dimensional open pores. The porous metal medium comprises metal fibers. The first layer is permanently bonded to the porous metal medium thereby closing the pores of the porous metal medium at the side where the first layer is located.

13 Claims, 2 Drawing Sheets

Figure 1:
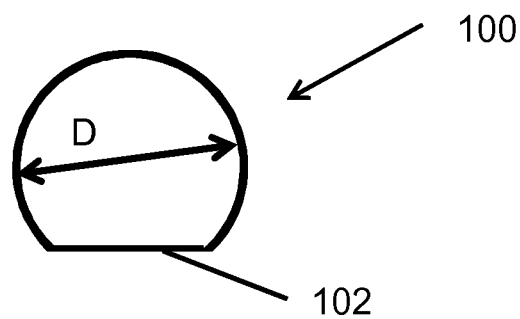

(51) Int. Cl.
*B24B 37/30* (2012.01)
*B22F 7/00* (2006.01)
*B32B 15/04* (2006.01)
*B32B 15/14* (2006.01)
*B24B 37/27* (2012.01)
*B22F 3/00* (2006.01)
*B22F 3/11* (2006.01)

(52) U.S. Cl.
CPC .............. *B24B 37/30* (2013.01); *B32B 15/01* (2013.01); *B32B 15/046* (2013.01); *B32B 15/14* (2013.01); *B22F 2999/00* (2013.01); *H01L 2221/68318* (2013.01); *H01L 2221/68327* (2013.01); *H01L 2221/68381* (2013.01)

(56) References Cited

U.S. PATENT DOCUMENTS

| | | | | |
|---|---|---|---|---|
| 5,858,537 | A * | 1/1999 | Brown | H01L 23/3732 156/167 |
| 6,439,984 | B1 * | 8/2002 | Andres | B24B 37/28 264/130 |
| 6,566,267 | B1 * | 5/2003 | Wenski | H01L 21/02024 216/91 |
| 7,541,287 | B2 * | 6/2009 | Schmolke | B24B 37/28 438/691 |
| 8,376,811 | B2 * | 2/2013 | Schwandner | B24B 7/228 451/190 |
| 8,721,390 | B2 * | 5/2014 | Schwandner | B24B 37/044 438/692 |
| 8,882,096 | B2 | 11/2014 | Nakamura et al. | |
| 9,343,348 | B2 * | 5/2016 | Thallner | H01L 21/6835 |
| 2001/0005043 | A1 | 6/2001 | Nakanishi et al. | |
| 2002/0119286 | A1 * | 8/2002 | Chen | B23H 5/08 428/131 |
| 2004/0188020 | A1 | 9/2004 | Yuasa et al. | |
| 2004/0229548 | A1 * | 11/2004 | Kann | B24B 37/08 451/28 |
| 2004/0231793 | A1 | 11/2004 | Kroninger et al. | |
| 2004/0235402 | A1 * | 11/2004 | Bjelopavlic | B24B 37/28 451/170 |
| 2005/0173064 | A1 | 8/2005 | Miyanari | |
| 2006/0128276 | A1 * | 6/2006 | Horiguchi | B24B 37/28 451/41 |
| 2006/0172671 | A1 * | 8/2006 | Chen | B24B 37/046 451/548 |
| 2006/0201571 | A1 * | 9/2006 | Stobbe | G06K 19/027 139/426 R |
| 2007/0021042 | A1 * | 1/2007 | Schmolke | B24B 37/28 451/170 |
| 2007/0110975 | A1 | 5/2007 | Schneweis | |
| 2008/0146121 | A1 * | 6/2008 | Ozgun | B23H 5/08 451/37 |
| 2009/0086177 | A1 * | 4/2009 | Vosters | G03F 7/70716 355/53 |
| 2009/0197070 | A1 | 8/2009 | Miyanari | |
| 2009/0325467 | A1 | 12/2009 | Nakamura et al. | |
| 2010/0099337 | A1 * | 4/2010 | Kerstan | B24B 7/17 451/57 |
| 2010/0279586 | A1 * | 11/2010 | Schwappach | B24D 11/00 451/28 |
| 2010/0330881 | A1 * | 12/2010 | Schwandner | B24B 7/228 451/41 |
| 2011/0141448 | A1 * | 6/2011 | Aoki | B65G 49/064 355/72 |
| 2011/0244762 | A1 * | 10/2011 | Schwandner | B24B 37/044 451/41 |
| 2011/0247560 | A1 * | 10/2011 | Yasui | C23C 16/407 118/724 |
| 2012/0187105 | A1 * | 7/2012 | Parks | F27B 9/021 219/388 |
| 2015/0075992 | A1 * | 3/2015 | Cui | C02F 1/4608 204/674 |
| 2015/0170953 | A1 * | 6/2015 | Thallner | H01L 21/6835 438/459 |
| 2015/0214083 | A1 * | 7/2015 | Kawakami | H01L 21/67248 156/345.27 |
| 2016/0129432 | A1 * | 5/2016 | Ozaki | B01J 23/30 423/245.1 |
| 2018/0040500 | A1 * | 2/2018 | Goossens | B22F 7/004 |
| 2018/0218885 | A1 * | 8/2018 | Maeda | C23C 16/5096 |
| 2018/0298483 | A1 * | 10/2018 | Vieluf | C23C 14/0605 |

* cited by examiner

CARRIER FOR TEMPORARY BONDED WAFERS

TECHNICAL FIELD

The invention relates to the field of carriers for wafers. The carrier can be used for the temporary bonding of wafers during their processing, e.g. in wafer thinning.

BACKGROUND ART

The use of temporary bonding of wafers onto a carrier to allow processing of the wafer is well known. A challenge is the subsequent debonding of the wafer from the carrier. Different carriers have been described that allow debonding by means of a solvent. In such processes, the adhesive used for the temporary bonding is chemically dissolved.

US2009/197070A describes a support plate that bonds to a substrate so as to support the substrate. In the support plate, a plurality of openings penetrate through from a bonding surface to a non-bonding surface. The bonding surface faces the substrate, and the non-bonding surface faces the bonding surface. A porous region, which includes a first region and a second region surrounding the first region, is formed on the bonding surface; and the first region has an opening ratio greater than that of the second region. This way, it is possible to realize a support plate that can be easily peeled off from a semiconductor wafer with a solvent, but does not easily come off from a substrate during a processing operation on the semiconductor wafer.

US2005/0173064A1 provides a supporting plate that has a structure in which a solvent can be supplied to an adhesive layer between the supporting plate and a substrate—such as a semiconductor wafer—in a short period of time after the substrate is thinned. The document also discloses a method for stripping the supporting plate. The supporting plate may have a larger diameter than the semiconductor wafer, and penetrating holes are formed in the supporting plate. The outer peripheral portion of the supporting plate is a flat portion in which no penetrating hole is formed. When alcohol is poured from above the supporting plate, the alcohol reaches the adhesive layer through the penetrating holes, dissolves and removes the adhesive layer.

U.S. Pat. No. 8,882,096B2 discloses a perforated support plate for supporting a surface of a wafer by interposing an adhesive layer. The perforated support plate has penetration holes. Solvent to dissolve the adhesive with which the perforated support plate is adhered to a wafer penetrates through the perforations of the support plate. The perforated support plate comprises a reinforcing part for deflection prevention.

US2004/0231793A1 discloses the use of a porous sintered metal as temporary carrier for wafers. The carrier can be released by solvent passing through the thickness of the temporary carrier through its pores in order to dissolve the adhesive used to adhere the wafer to the temporary carrier.

US2009325467A describes a process wherein a wafer can be thinned without occurrence of dimples. A support plate has a number of through holes. A circuit forming surface of a wafer is adhered to one surface of the support plate by an adhesive member, and a dimple prevention member having a thickness of 100 μm or more and having an adhesive layer on one face is adhered to the other surface. Thus the openings at both ends of the through holes are blocked. The support plate is vacuum adsorbed to a support table through the dimple prevention member, and the wafer is ground/polished to thin the wafer. The dimple prevention member is stripped off, and a solvent is penetrated into the adhesive member through the through holes to detach the wafer from the support plate.

US2001005043A discloses a technique which performs the thinning of a wafer and the separation thereof from a support substrate with high yields and in a short time. A hole-free support substrate is bonded to a second surface of a support substrate having holes with an adhesive layer melted by heating so as to block the holes. A wafer is bonded to a first surface of the support substrate having the holes with an adhesive layer melted by solvent. The wafer is thinned by grinding and etching. The adhesive layer is melted by heating and the support substrate having the holes is slid with respect to the hole-free support substrate to thereby separate the support substrate having the holes from the hole-free support substrate. The adhesive layer is then dissolved by solvent through the holes defined in the support substrate having the holes. Thereby the wafer is separated from the support substrate having the holes. As no load is put on the wafer, wafer damage is prevented.

DISCLOSURE OF INVENTION

It is an objective of the invention to provide a carrier for temporary wafer bonding. It is the objective to provide such a carrier with improved properties. It is an objective of the invention to provide a carrier that allows easy debonding of the wafer by dissolving the adhesive using a solvent percolating through the pores of the carrier. It is an objective of the invention to provide a carrier that allows that wafers can be thinned thereby obtaining the required quality specifications.

The first aspect of the invention is a carrier onto which a wafer can be temporarily bonded, e.g. to allow wafer thinning. The carrier comprises a plate shaped laminate. The plate shaped laminate comprises a first layer. The first layer comprises a metal foil or a metal sheet. The plate shaped laminate comprises a second layer comprising a porous metal medium with three-dimensional open pores. The porous metal medium comprises metal fibers. The first layer is permanently bonded to the porous metal medium thereby closing the pores of the porous metal medium at the side where the first layer is located.

The first layer is permanently bonded to the porous metal medium such that during and after debonding a wafer temporarily bonded to the carrier, the first layer remains bonded to the porous metal medium.

Preferably, the carrier has the shape of a disk, possibly wherein the disk deviates from a circular circumference by a linear side. The linear side is present in order to match the shape of a wafer to be bonded to the work carrier. Preferably the diameter of the circular section of the disk is suited for 6 inch, for 8 inch, or for 12 inch wafers. This means that the diameter of the disk is equal or slightly larger than the diameter of the wafer.

The carrier has the benefit that debonding solvent can flow through the three-dimensional open pores of the porous metal medium, from the side edges of the carrier adhesively bonded onto a wafer, through the whole volume of the porous metal medium. This way, debonding solvent can reach the adhesive layer attaching the wafer to the carrier fast. The carrier has sufficient stiffness to transport the bonded wafer through the different process steps without the occurrence of bending or other mechanical deformation. The carrier has the further benefit that it has sufficient mechanical properties, e.g. stiffness, in order to allow to reach the required dimensional properties of the thinned wafer, such as total thickness variation (TTV), bow and warp. It is a further benefit of the invention that the carrier can be re-used multiple times.

Specific examples of the porous metal medium include sintered or welded metal fiber nonwovens. It is also possible to have in the second layer a multiple number of layers, wherein layers can be selected from layers comprising or consisting out of metal fibers, metal powder or metal foam; wherein at least one layer comprises metal fibers.

Preferably, the first layer covers at least one planar side of the second layer; more preferably, the first layer covers the full surface of at least one planar side of the second layer.

In a preferred embodiment, the first layer covers the full surface of one planar side of the second layer.

Preferably, the first layer is provided out of or comprises the same metal or alloy as the porous metal medium.

Preferably, the porous metal medium comprises or is made out of stainless steel, titanium, palladium or tungsten; or out of an alloy comprising for more than 50% by weight of titanium, palladium or tungsten. More preferably, the first layer comprises or is made out of the same metal or metal alloy as the porous metal medium.

In a preferred embodiment, the first layer is permanently bonded to the porous metal medium by means of metallic bonds, preferably by means of diffusion bonding, such as sintering, or by means of welding (and preferably by means of welding wherein no additional filler material is used in the welding process). An example of a welding process that can be used is capacity discharge welding (CDW).

In a preferred embodiment, the first layer is permanently bonded to the porous metal medium by means of an adhesive. The adhesive can be selected from the wide range of adhesives that are not attacked by the debonding liquid used when debonding the temporarily bonded wafer from the carrier. Examples of suitable adhesives are adhesives based on epoxy.

Preferably, the carrier has a thickness between 650 μm and 750 μm.

Preferably, the first layer has a thickness between 20 μm and 650 μm, more preferably between 150 μm and 650 μm.

Preferably, the porous metal medium has a thickness between 50 μm and 150 μm, more preferably between 50 μm and 150 μm.

Preferably, the porosity of the porous metal medium is between 30 and 80%, more preferably between 50 and 80%, even more preferably between 60 and 80%.

Such embodiments synergistically add to improve the mechanical properties of the carrier, so that the wafer can fulfil the requirements of dimensional characteristics after its processing while being bonded onto the carrier.

Preferably, the equivalent diameter of the metal fibers is between 2 and 50 μm, more preferably between 2 and 40 μm, even more preferably between 2 and 25 μm. Even more preferably between 10 and 25 μm. With equivalent diameter is meant the diameter of the circle having the same area as the cross section of a fiber, cross sectional shape which can deviate from a circular shape.

Preferably, the porous metal medium has a surface for being bonded onto a wafer, wherein this surface is parallel with the first layer. This surface is preferably polished so that the carrier has a total thickness variation (TTV) less than 10 μm, more preferably less than 5 μm; and even more preferably less than 2 μm. The total thickness variation (TTV) is measured by a drop gauge measurement on 5 points, selected randomly over the surface of the material. For the test method, the diameter of the drop gauge is 5.99 mm. The TTV is defined as the difference between the maximum thickness measured and the minimum thickness measured.

Preferably, the surface of the second layer onto which the wafer will be temporarily bonded, has a surface roughness Ra less than 1 μm, more preferably less than 0.5 μm. As is known to the skilled person, Ra is the arithmetic mean of the deviations of the measured roughness points from their average.

Preferably, the porous metal medium comprises or consists out of a first porous layer and a second porous layer. The first porous layer is provided between the first layer and the second porous layer. The porosity of the first porous layer is higher than the porosity of the second porous layer. Preferably, the second porous layer is provided for temporarily bonding a wafer onto it.

In a more preferred embodiment, the first porous layer is directly bonded to the first layer. In a further preferred embodiment, the second porous layer is directly bonded to the first porous layer. In a further embodiment, the second porous layer is provided for being bonded onto the wafer. In a more preferred embodiment, the first porous layer comprises metal fibers of a first equivalent diameter (e.g. 22 μm) and the second porous layer comprises metal fibers of a second equivalent diameter (e.g. 14 μm). In an even more preferred embodiment, the first equivalent diameter is larger than the second equivalent diameter.

Preferably, the second layer comprises a contact layer for being bonded onto a wafer. The contact layer can comprise a mixture of metal fibers and metal powder. The metal fibers and the metal powder are permanently bonded to each other at their contacting points. In a preferred such embodiment, the porosity of the porous metal medium is more than 20% and preferably more than 30%, more preferably more than 40%, even more preferably more than 50%, even more preferably more than 55%. And preferably the porosity is less than 80%, more preferably less than 60%.

In a preferred such embodiment, the porosity of the contact layer is more than 20% and preferably more than 30%. And preferably the porosity of the contact layer is less than 50%, more preferably less than 40%.

In a preferred embodiment, the porous metal medium comprises an additional porous layer, provided between the first layer and the contact layer. The additional porous layer can comprise metal fibers, metal powder, or metal foam. Specific examples of the additional porous layer include sintered or welded metal fiber nonwovens, sintered metal powders, and metal foam.

Preferably, the metal powder in the contact layer has a diameter within the range of 2 to 30 μm, preferably within the range of 2 to 20 μm, more preferably within the range of 2 to 10 μm.

In a preferred embodiment, the side edges of the porous metal medium are permanently sealed so that no open pores are present at the side edges of the porous metal medium. Preferably, the sealing of the side edges is fully provided by metal.

The side edges can be sealed by means of welding of the edges, or by means of laser cutting to size and shape operation of the porous metal medium, or by means of a welding of the edges or by means of laser cutting operation to size and shape of the combination of the first layer and the second layer after bonding the first layer to the second layer.

An alternative method for creating the sealing edges is by machining a plate so that the upstanding edges are created, and the porous metal medium is inserted in the cup that is created by the machining, and subsequent bonding of the porous metal medium onto the first layer. When a temporary bonded wafer is to be debonded from a carrier with permanently sealed edges, initially no wicking of the debonding liquid occurs in the porous metal medium. Initial debonding happens on the thin layer of adhesive between the carrier and the wafer. When this thin adhesive layer is broken down, the debonding speed increases by having increased wicking of the debonding liquid in the porous metal medium, through the openings created by dissolving the glue layer at the edge.

In a preferred embodiment, the carrier is provided such that when applying a pressure of 4 bar onto the carrier, the permanent deformation of the carrier is less than 5% of its original thickness before applying the pressure. This can be tested by measuring the thickness of the carrier before and after applying a pressure of 4 bar during a time period of 20 seconds. A carrier according to this embodiment can be made by prepressing the carrier or the porous metal layer or porous metal layers in it so that future permanent deformation is limited. Such embodiments surprisingly synergistically improve the properties of the wafer after its processing (e.g. thinning) while being temporarily adhered to the carrier.

A second aspect of the invention is an assembly (or stack) of a wafer and a carrier as in the first aspect of the invention. The wafer is bonded by means of an adhesive onto the second layer. Preferably, the adhesive is an adhesive that can be removed by means of contacting a suitable debonding liquid to the adhesive.

A third aspect of the invention is a method for the processing of wafers. The method comprises the steps of
- temporarily adhering a wafer to a carrier as in the first aspect of the invention by means of an adhesive,
- processing the wafer temporarily adhered to the carrier, e.g. thinning the wafer;
- debonding the wafer from the carrier, by means of a debonding liquid breaking up the temporary adhesive bond between the wafer and the carrier; wherein the debonding liquid penetrates into the porous metal medium from the side edges of the assembly of the wafer bonded by means of adhesive to the carrier.

During and after debonding a wafer temporarily bonded to the carrier, the first layer remains bonded to the porous metal medium.

In a preferred method, the carrier is after debonding re-used one or more times for temporarily adhering another wafer onto it. Preferably, the carrier can be used at least 5 times, more preferably at least 10 times.

BRIEF DESCRIPTION OF FIGURES IN THE DRAWINGS

FIG. 1 shows a top view of an exemplary carrier according to the invention.
FIGS. 2-5 show cross sections of exemplary carriers according to the invention.
FIG. 6 shows an example of an assembly of a wafer temporarily bonded to an inventive carrier.

MODE(S) FOR CARRYING OUT THE INVENTION

FIG. 1 shows the top view of a carrier 100 according to the invention. The carrier 100 has the shape of a disk deviating from a circular circumference (with diameter D) by a linear side 102. The linear side 102 is present in order to match the shape of a wafer to be bonded to the work carrier.

Figure 2:
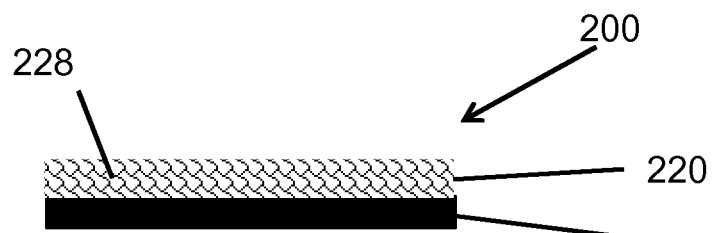

FIG. 2 shows a cross section of an exemplary carrier 200 according to the invention. The carrier 200 comprises a first layer 210, wherein the first layer is a metal foil or a metal sheet. The carrier 200 further comprises a nonwoven metal fiber web 220 (e.g. sintered or bonded by means of capacity discharge welding), comprising metal fibers 228. Preferably, the metal foil or metal sheet and the metal fibers are out of the same metal or alloy. The nonwoven metal fiber web 220 is permanently bonded to the first layer 210, e.g. by means of an adhesive (e.g. an epoxy adhesive) or by means of sintering or by means of welding (e.g. capacity discharge welding).

Figure 3:
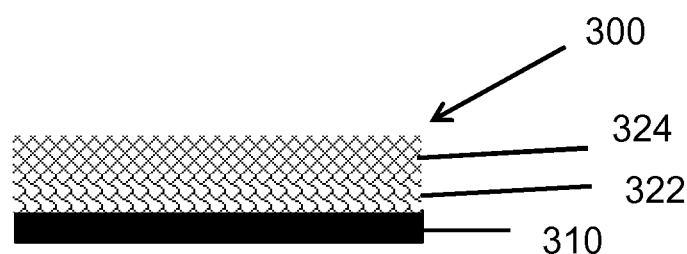

FIG. 3 shows a cross section of an exemplary carrier 300 according to the invention. The carrier 300 comprises a first layer 310, wherein the first layer is a metal foil or a metal sheet. The carrier 300 further comprises a first porous layer, e.g. a sintered nonwoven metal fiber web 322; and a second porous layer, e.g. another sintered nonwoven metal fiber web 324. The porosity of the first porous layer is higher than the porosity of the second porous layer.

Preferably, the metal foil or metal sheet and the metal fibers of both sintered nonwoven metal fiber webs are out of the same metal or alloy. The nonwoven metal fiber webs 322, 324 are permanently bonded to each other and to the first layer 310, e.g. by means of an adhesive (e.g. an epoxy adhesive); or by means of sintering or by means of welding (e.g. capacity discharge welding).

Instead of one or both of the nonwoven metal fiber webs, sintered porous powder layers and/or metal foam layers can be used for the first porous layer and/or for the second porous layer.

Figure 4:
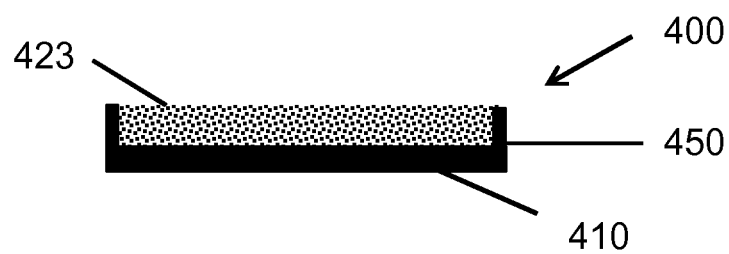

FIG. 4 shows a cross section of an exemplary carrier 400 according to the invention. The carrier 400 comprises a first layer 410, wherein the first layer is a metal foil or a metal sheet. The carrier 400 further comprises a porous metal medium 423, e.g. as discussed in the previous examples. The side edges 450 of the porous metal medium are permanently sealed so that no open pores are present at the side edges 450 of the porous metal medium 423. The side edges can be sealed by means of a welding or laser cutting operation on the edges of the porous metal medium 423, or by means of a welding or laser cutting operation on the combination of the first layer and the second layer after bonding the first layer to the second layer.

An alternative method for creating the sealing edges is by machining a plate so that the upstanding edges are created. The porous metal medium is then inserted in the cup that is created by the machining. Subsequently, bonding of the porous metal medium onto the first layer is performed. When a temporary bonded wafer is to be debonded from this carrier, initially no wicking of the debonding liquid occurs in the porous metal medium and initial debonding happens on the thin layer of adhesive between the carrier and the wafer. When this thin adhesive layer is broken down, the debonding speed increases by having an increased wicking of the debonding liquid in the porous metal medium through the openings created by dissolving the glue layer at the edge.

Figure 5:
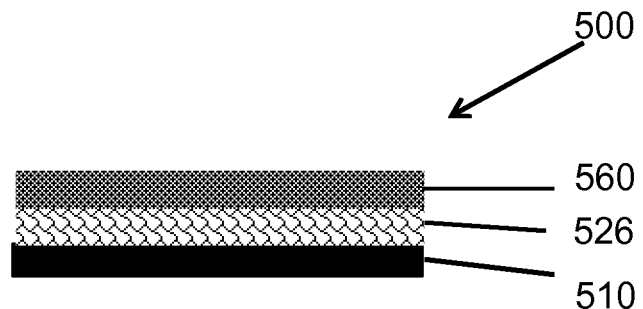
Figure 6:
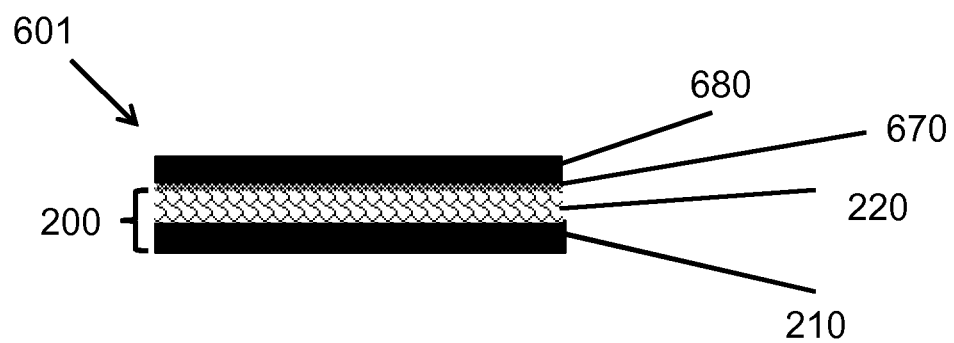

FIG. 5 shows a cross section of an exemplary carrier 500 according to the invention. The carrier 500 comprises a first layer 510, wherein the first layer is a metal foil or a metal sheet. The carrier 500 further comprises an additional porous layer 526, e.g. a sintered nonwoven metal fiber web. The carrier comprises a contact layer 560 consisting out of a mixture of metal powder particles and metal fibers, sintered to each other at contacting points.

Preferably, the metal foil or metal sheet, the metal fibers and the metal powder are out of the same metal or alloy.

The different layers are permanently bonded to each other by means of sintering or by means of welding (e.g. capacity discharge welding). Instead of the nonwoven metal fiber web as additional layer, sintered porous powder layers and/or metal foam layers can be used.

FIG. 6 shows an example of an assembly or stack 601 of a wafer temporarily bonded to a carrier, e.g. the carrier 200 of the example of FIG. 2. Same reference numbers as in FIG. 2 have the same meaning as described for FIG. 2. A temporary adhesive layer 670 is applied onto the porous metal medium of the carrier 200, and a wafer is 680 is temporarily bonded to the carrier 200 via this adhesive layer 670.

As an example of the invention, a carrier has been made. The carrier comprises a 100 µm thick titanium foil and a porous nonwoven titanium fiber medium of 600 µm thickness. The carrier has a total thickness of 700 µm. The nonwoven titanium fiber medium was sintered directly onto the titanium foil; and is a fiber sheet of 22 µm diameter fibers with a density 1000 g/m$^2$, meaning 56% porosity.

As an example of the invention, a carrier has been made. The carrier comprises a 100 µm thick titanium foil and a porous nonwoven titanium fiber medium of 600 µm thickness. The porous metal medium comprises a first porous layer and a second porous layer. The first porous layer comprises titanium fibers of 22 µm equivalent diameter and has 74 µm thickness. The second porous layer comprises titanium fibers of 14 µm equivalent diameter and has 526 µm thickness.

As an example of the invention, a carrier has been made having a first layer out of a 150 µm thick titanium foil. A nonwoven titanium fiber medium of 500 g/m$^2$ consisting out of titanium fibers of 22 µm equivalent diameter and 14 mm fiber length was sintered onto the titanium foil, thereby establishing sinter bonds between contacting titanium fibers on the one hand; and between the titanium fibers and the titanium foil on the other hand, resulting in a total thickness 400 µm of the structure. The porosity of the porous layer was 56%. The surface of the carrier to be bonded onto a wafer can be polished below a total thickness variation (TTV) of the carrier of 10 µm.

A150 mm by 150 mm square sized carrier has been temporarily glued using a standard available silicon based adhesive to a glass substrate of the same size. The glass substrate simulates a wafer. Immersing the solution in a debonding liquid (Daeclean 300—a commercially available solvent system for removal of cured silicone—was used) showed proper debonding by wicking of the debonding liquid inside the titanium medium from the side edges of the carrier. The wicking could be followed by visual observation through the glass plate. The debonding liquid fully wicked inside the porous metal medium in a short time period of 2 minutes 40 seconds, resulting in fully debonding the carrier from the glass plate. It will be clear to the skilled person that in the same way as a metal fiber nonwoven web, a sintered metal powder layer or metal foam can be used as porous metal medium. However, metal fiber nonwovens are preferred because, due to the elongated shape of the fibers, a different pore size is obtained which is believed to optimize wicking.

Preferably, the carrier is provided such that when applying a pressure of 4 bar onto it, the permanent deformation of the carrier is less than 5% of its original thickness before applying the pressure. This can be tested by measuring the thickness of the carrier before and after applying a pressure of 4 bar during a time period of 20 seconds. A carrier according to this embodiment can be made by prepressing the carrier or the porous metal layer or porous metal layers in it so that future permanent deformation is limited. Such embodiments surprisingly synergistically improve the properties of the wafer after its processing (e.g. thinning) while being temporarily adhered to the carrier.

The invention claimed is:

1. Carrier onto which a wafer can be temporarily bonded, wherein the carrier comprises a plate shaped laminate, the plate shaped laminate comprises:
   a first layer, wherein the first layer comprises a metal foil or a metal sheet; and
   a second layer comprising a porous metal medium with three-dimensional open pores; wherein the porous metal medium comprises metal fibers;
   wherein the first layer is permanently bonded to the porous metal medium thereby closing the pores of the porous metal medium at the side where the first layer is located.

2. Carrier as in claim 1, wherein the first layer comprises the same metal or alloy as the porous metal medium.

3. Carrier as in claim 1, wherein said porous metal medium comprises stainless steel, titanium, palladium or tungsten; or comprises alloy comprising for more than 50% by weight of titanium, palladium or tungsten.

4. Carrier as in claim 1, wherein the first layer is permanently bonded to the porous metal medium by means of metallic bonds.

5. Carrier as in claim 1, wherein the first layer is permanently bonded to the porous metal medium by means of an adhesive.

6. Carrier as claim 1, wherein the porosity of the porous metal medium is between 30 and 80%.

7. Carrier as in claim 1, wherein the equivalent diameter of the metal fibers is between 2 and 50 µm.

8. Carrier as in claim 1, wherein the porous metal medium has a surface for being bonded onto a wafer, wherein this surface is parallel with the first layer; and wherein this surface is polished so that the carrier has a total thickness variation (TTV) less than 10 µm.

9. Carrier as in claim 1,
   wherein the porous metal medium comprises a first porous layer and a second porous layer,
   wherein the first porous layer is provided between the first layer and the second porous layer;
   and wherein the porosity of the first porous layer is higher than the porosity of the second porous layer.

10. Carrier as in claim 1, wherein the second layer comprises a contact layer for being bonded onto a wafer,
    wherein the contact layer comprises a mixture of metal fibers and metal powder,
    wherein the metal fibers and the metal powder are permanently bonded to each other at their contacting points.

11. Carrier as in claim 1, wherein the side edges of the porous metal medium are permanently sealed so that no open pores are present at the side edges of the porous metal medium.

12. Assembly of a wafer and a carrier as in claim 1,
    wherein the wafer is bonded onto said second layer by means of an adhesive.

13. Method for the processing of wafers, comprising the steps of
    temporarily adhering a wafer to a carrier as in claim 1 by means of an adhesive,
    processing the wafer temporarily adhered to the carrier;
    debonding the wafer from the carrier, by means of a debonding liquid breaking up the temporary adhesive bond between the wafer and the carrier; wherein the debonding liquid penetrates into the porous metal medium from the side edges of the assembly of the wafer bonded by means of adhesive to the carrier.

\* \* \* \* \*